(12) United States Patent
Gallo et al.

(10) Patent No.: US 7,164,607 B2
(45) Date of Patent: Jan. 16, 2007

(54) DUAL BUS MEMORY BURST ARCHITECTURE

(75) Inventors: Girolamo Gallo, Avezzano (IT);
Giuliano Gennaro Imondi, Rieti (IT);
Giovanni Naso, Frosinone (IT);
Tommaso Vali, Sezze (IT)

(73) Assignee: Micron Technology, Inc., Boise, ID (US)

( * ) Notice: Subject to any disclaimer, the term of this patent is extended or adjusted under 35 U.S.C. 154(b) by 25 days.

(21) Appl. No.: 11/142,114

(22) Filed: Jun. 1, 2005

(65) Prior Publication Data

US 2005/0207233 A1 Sep. 22, 2005

Related U.S. Application Data

(63) Continuation of application No. 10/367,587, filed on Feb. 14, 2003, now Pat. No. 6,917,545.

(30) Foreign Application Priority Data

Jul. 9, 2002 (IT) .............................. RM02A0369

(51) Int. Cl.
*G11C 7/10* (2006.01)

(52) U.S. Cl. ............................ 365/189.01; 365/189.02; 365/189.05; 365/189.12; 365/230.02; 365/230.04

(58) Field of Classification Search ........... 365/189.01, 365/189.02, 189.05, 189.12, 230.02, 230.04
See application file for complete search history.

(56) References Cited

U.S. PATENT DOCUMENTS

| | | | |
|---|---|---|---|
| 5,732,406 A | 3/1998 | Bassett | |
| 5,877,990 A * | 3/1999 | Kim | ..................... 365/189.05 |
| 6,202,120 B1 | 3/2001 | Lang | |
| 6,243,309 B1 | 6/2001 | Shin | |
| 6,580,637 B1 | 6/2003 | Pascucci | |
| 2003/0021163 A1* | 1/2003 | Nakazawa et al. ..... 365/189.12 | |

* cited by examiner

*Primary Examiner*—Anh Phung
*Assistant Examiner*—Pho M. Luu
(74) *Attorney, Agent, or Firm*—Leffert Jay & Polglaze, P.A.

(57) ABSTRACT

Methods and apparatus for a memory device including a burst architecture employ a double bus architecture that is multiplexed onto an output bus. The resulting architecture effectively facilitates doubling throughput without increasing memory device latency.

22 Claims, 7 Drawing Sheets

DUAL BUS MEMORY BURST ARCHITECTURE

RELATED APPLICATION

This application is a continuation of U.S. patent application Ser. No. 10/367,587 filed Feb. 14, 2003 now U.S. Pat. No. 6,917,545, issued on Jul. 12, 2005, and titled, "Dual Bus Memory Burst Architecture," which claims priority to Italian Patent Application Serial No. RM2002A000369, filed Jul. 9, 2002, entitled "Dual Bus Memory Burst Architecture," both of which are commonly assigned.

TECHNICAL FIELD

The present invention is related to a method and apparatus for increasing the throughput for a memory device, in particular, a method and apparatus for a burst architecture with a double clock rate in a memory device.

BACKGROUND INFORMATION

Memory designers strive to increase the throughput of memories, i.e., the speed of the data read from or written to the memory, expressed generally in megabytes per second (Mbytes/second), to match the increasing speed of microprocessors associated with the memory in a system. One way to increase throughput is to use a burst architecture in which the data flows out of the memory in bursts of data. The data is first fetched from the memory and stored in registers, then it is clocked out in bursts by a fast clock from the registers to the output (I/Os). One limitation of the burst method is that data in the bursts comes from memory locations nearby. This limitation, however, is generally accepted because it is very likely that the next data needed will be very close in the memory space to the previously fetched data. For this reason burst architectures are very common in memories, particularly in DRAM and flash memories.

SUMMARY OF THE INVENTION

For one embodiment, the invention provides a method of accessing a memory device. The method includes latching a plurality of data words, providing a first data word to a first data bus at a first time and providing a second data word to a second data bus at a second time while the first data word is being provided to the first data bus. The method further includes providing the first data word to an output bus from the first data bus at the second time and providing the second data word to the output bus from the second data bus at a third time while providing a third data word to the first data bus.

For another embodiment, the invention provides a memory device. The memory device includes a memory array, a plurality of sensing devices coupled to the memory array, a first data bus for receiving data words from a first portion of the plurality of sensing devices, a second data bus for receiving data words from a second portion of the plurality of sensing devices and a switch to multiplex the data words from the first and second data busses onto an output bus. The memory device is adapted to sequentially provide individual data words from the first portion of the plurality of sensing devices to the first data bus, to sequentially provide individual data words from the second portion of the plurality of sensing devices to the second data bus and to alternately provide data words form the first and second data busses onto the output bus.

The invention further provides methods and apparatus of varying scope.

BRIEF DESCRIPTION OF THE DRAWINGS

Features and advantages of the present invention will become more apparent from the following description of the preferred embodiments described below in detail with reference to the accompanying drawings where.

DETAILED DESCRIPTION

In the following detailed description, reference is made to the accompanying drawings that form a part hereof, and in which is shown by way of illustration specific embodiments in which the invention may be practiced. It is to be understood that other embodiments may be utilized and structural changes may be made without departing from the scope of the present invention.

Figure 1:
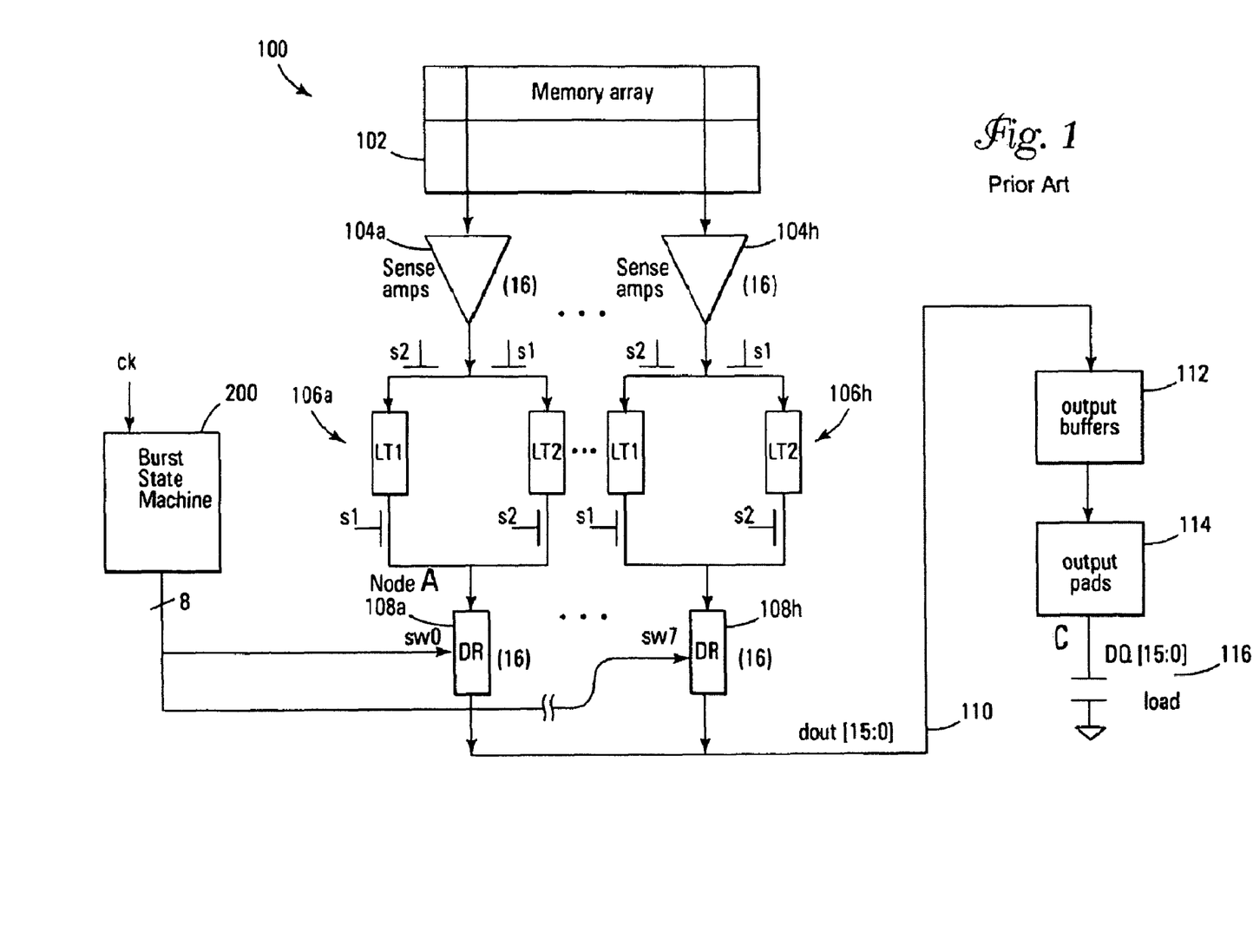
FIG. 1 is an illustration of one example of a conventional burst architecture for a memory.

One example of a burst memory scheme is shown in FIG. 1. In this example, data is fetched from the memory 100 in blocks of n words of m bits each (e.g., 8 words of 16 bits each). Data coming out from the memory cells of memory array 102 is read by n×m (e.g., 8×16) sense amp banks 104a to 104h. In FIG. 1, for simplicity, only two sense amp banks 104a and 104h are shown. The data is then loaded into 8 blocks of latches 106a to 106h. Other types of storage circuits or registers to maintain the data may of course be used. Each block 106a to 106h includes two latches each, LT1 and LT2, respectively.

Periodic signals s1 and s2 are provided by a controller such as burst state machine 200 to latch blocks 106a to 106h. s1 and s2 are periodic and clocked by the same external clock signal ck but are out of phase. Each s1, s2 signal lasts for n (e.g., n=8) clock cycles to allow the transfer of the n words to the output buffers through the drivers DR. In this example s1 and s2 are opposite in phase. During phase s1 data is transferred from sense amps 104a to 104h, to latches LT2 of latch blocks 106a to 106h and data previously stored in latches LT1 of latch blocks 106a to 106h is released to node A. During phase s2, data is stored in LT1 while data previously stored in latches LT2 is released to node A. This sequence continues for the duration of the burst operation and allows pipeline operation i.e., data is sent out of the chip at the same time as new data is retrieved from the memory.

In general, the speed of a data transfer is limited by the propagation delay of the device. In the example of FIG. 1, data is sent out of memory 100 at a speed that is a function of the propagation delay from the output of latches 106a to 106h at node A through the output pads 114 of memory 100 at node C. The path includes drivers (DR) 108a to 108h feeding the m bit (e.g., 16 bit) bus 110 (dout[15:0]), and output buffers 112 driving load 116 on output pads 114. The period of the signal for clocking the data through the device cannot be less than the propagation delay of the device. Thus, in FIG. 1 the period of the clock cannot be less than the time it takes data to propagate from node A to node C. For example, if the propagation delay is less than or equal to 24 ns and the clock is set at 24 ns, then every 24 ns a new word can be present on the output pads 114 (DQ[15:0]) at node C.

In the example of FIG. 1 where there are n words per burst (e.g., 8), the particular word coming out (w0 . . . w7) is selected by n signals (sw0 . . . sw7) generated by burst state machine 200, which is clocked by a clock ck. Each n signal (sw0 . . . sw7) lasts for one clock cycle.

Figure 2:
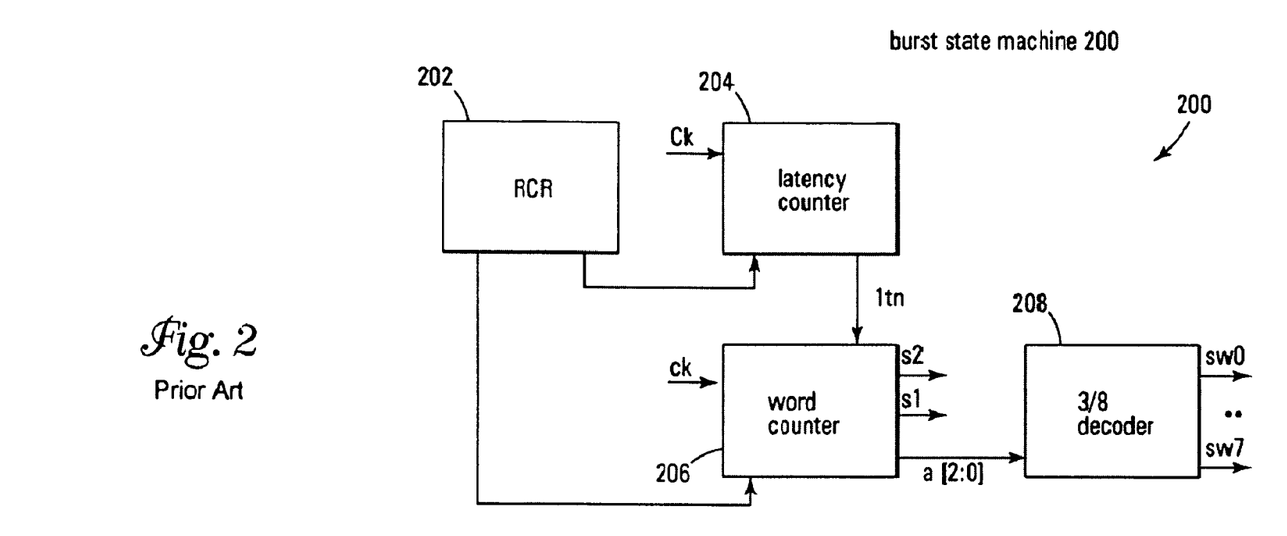
FIG. 2 is a block diagram of one example of a conventional burst state machine for a burst memory architecture.
Figure 2A:
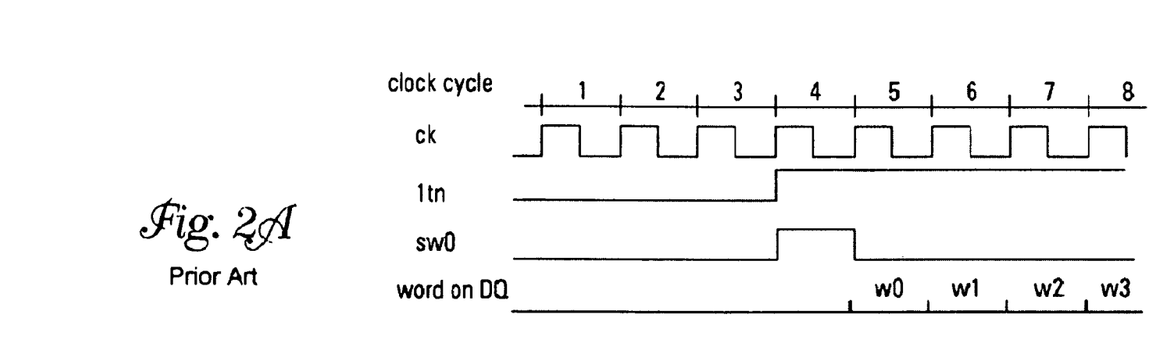
FIG. 2a is a simplified timing diagram of the operation of the burst state machine shown in FIG. 2.
Figure 2B:
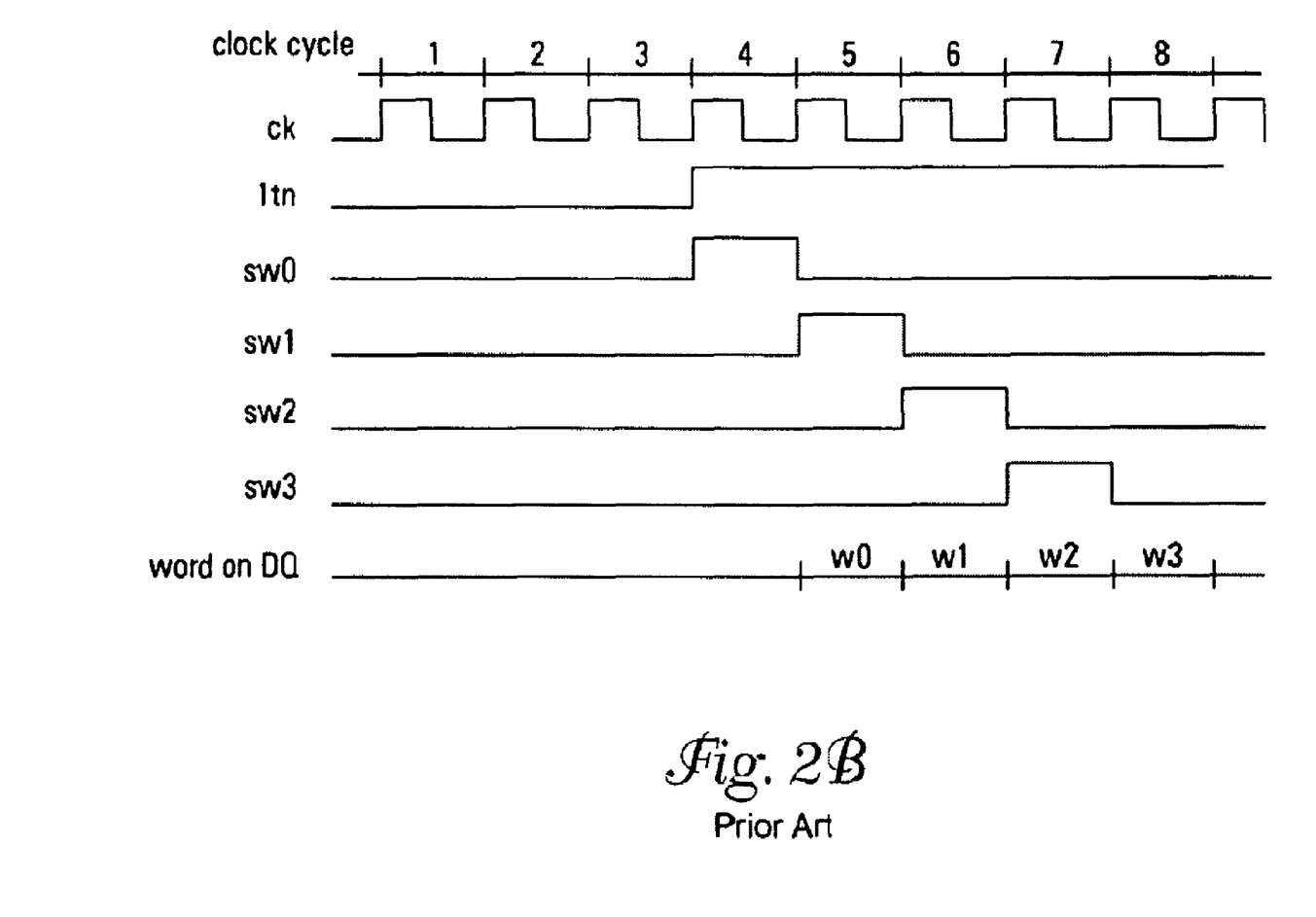
FIG. 2b shows a more detailed timing diagram of the operation of the burst state machine shown in FIG. 2.

An example of a simplified block diagram of controller or burst state machine 200 is shown in FIG. 2. FIG. 2a is a timing diagram of the first data after the latency. A more complete timing diagram including n signals (sw0 through sw7) is shown diagram in FIG. 2B, in the case of a burst if 4 data words are present. Burst state machine 200 includes a Read Configuration Register block (RCR) 202, which is used to set the count mode of word counter 206. RCR 202 is a set of latches that can be written by the user to set various count modes, such as: latency, burst length, active clock edge, count forward-backward, hold data for one clock or two clocks. Word counter 206 provides signals s1 and s2 and counter output (a[2:0]) which is supplied to a 3/8 decoder 208. For example, if word counter 206 is set to count up, the output of decoder 208 will be signal sw0 followed by sw1, then by sw2, and so on. One signal (sw0 . . . sw7) at a time is held in the active state by decoder 208 and is provided to drivers 306a to 306h thus enabling the selection of one word a time (w0 . . . w7) on the m bit bus 100 (dout[15:0]). RCR block 202 also sets the latency in latency counter 204. In the example of the FIG. 2, the latency is set to 4 cycles. After 3 clock cycles, the carry signal ltn is provided by latency counter 204 to word counter 206 to increment word counter 206 by one. After the $4^{th}$ clock cycle, which is needed to get the signals from A to C, w0 is present on the output pads 114 (DQ [15:0]). In this example, a latency of 4 clock cycles means that it takes 96 ns (i.e. 4×24 ns) from the rising edge of clock cycle 1 to the rising edge of clock cycle 4 for a data word to propagate to the output pads 114. It should be noted for the sake of clarity, that, in practice, a true 4 clock cycle latency requires that sw0 must be present 1–2 ns (the so-called "set-up time") before the rising edge of the $5^{th}$ clock. In fact, the external circuit (not shown in FIG. 2) that reads sw0 requires that the data be stable for a given a set-up time before the useful clock edge for strobing the data. The same applies for the n signals (sw1 . . . sw7). The set-up time, however, is not relevant to discussion of the present invention.

Figure 3:
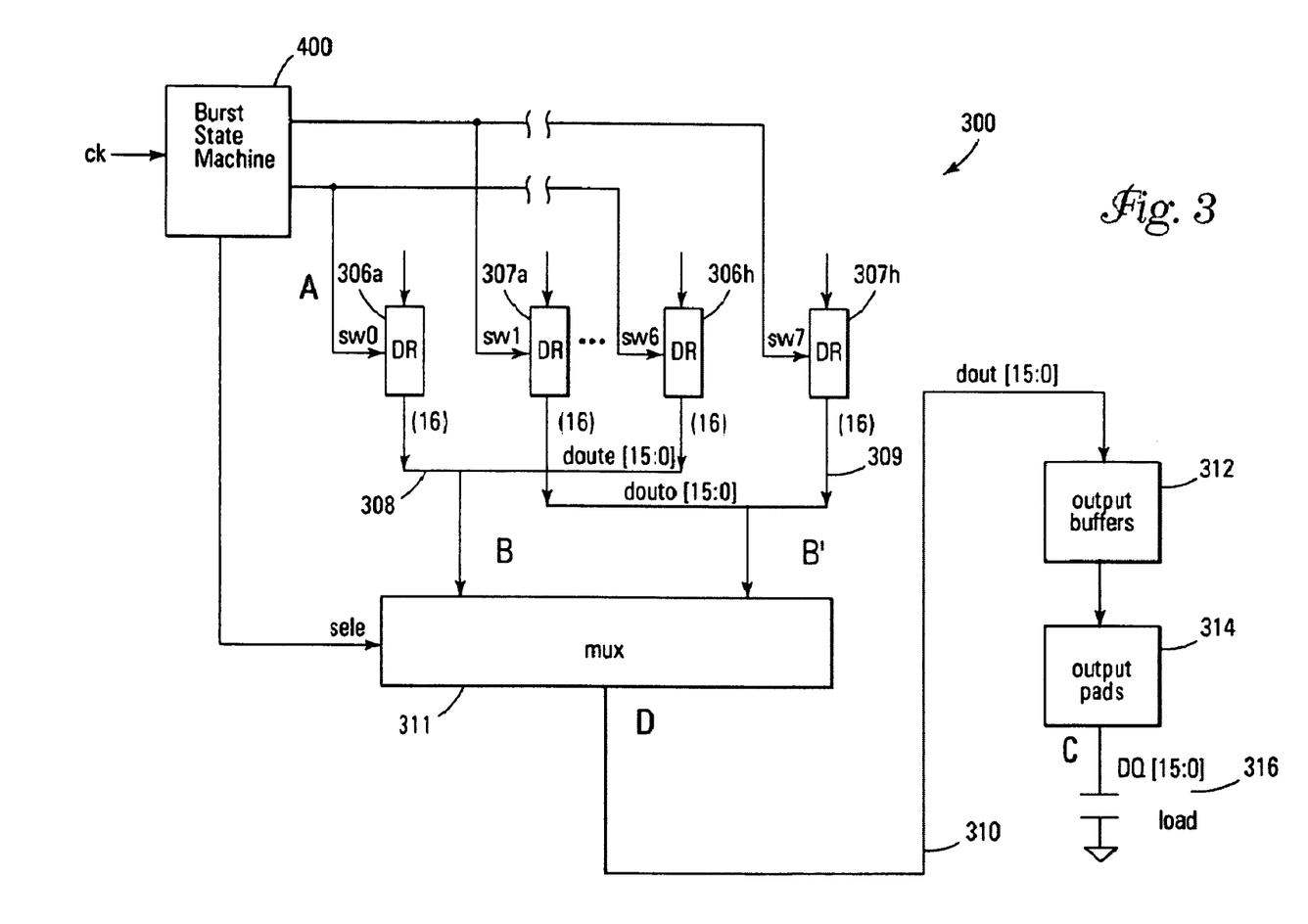
FIG. 3 shows one example of a double bus burst architecture for a memory according to the present invention.

An example of an architecture according to the present invention regarding the data path from A to B is shown in FIG. 3. In the example of FIG. 3, there are two data busses instead of one: an even data bus 308 (doute [15:0]), and an odd data bus 309 (douto [15:0]). Even data bus 308 collects only the even words, while odd data bus 309 collects the odd words. The even and the odd words are selected by signal sele applied to selection circuit 311, which may be a multiplexer. Sele can be provided by the burst state machine 400 or otherwise derived from ck. When sele is high, for example, even words are routed to bus 310 (dout[15:0]). When sele is low, the odd words are routed to bus 310 (dout[15:0]). The data path is actually split in two trunks: from A to B (or from A to B') and from D to C. Assuming, for the sake of simplicity, that there is negligible propagation delay in selection circuit 311, particular care should be taken in the layout, in order to equalize as much as possible the propagation delay from A to B (or from A to B') and from D to C. For typical memory devices, the propagation delay may be set to 12 ns from A to B (or B') and to 12 ns from D to C (for a total propagation delay from A to C of 24 ns, as before). The clock cycle is therefore set at 12 ns.

Figure 4:
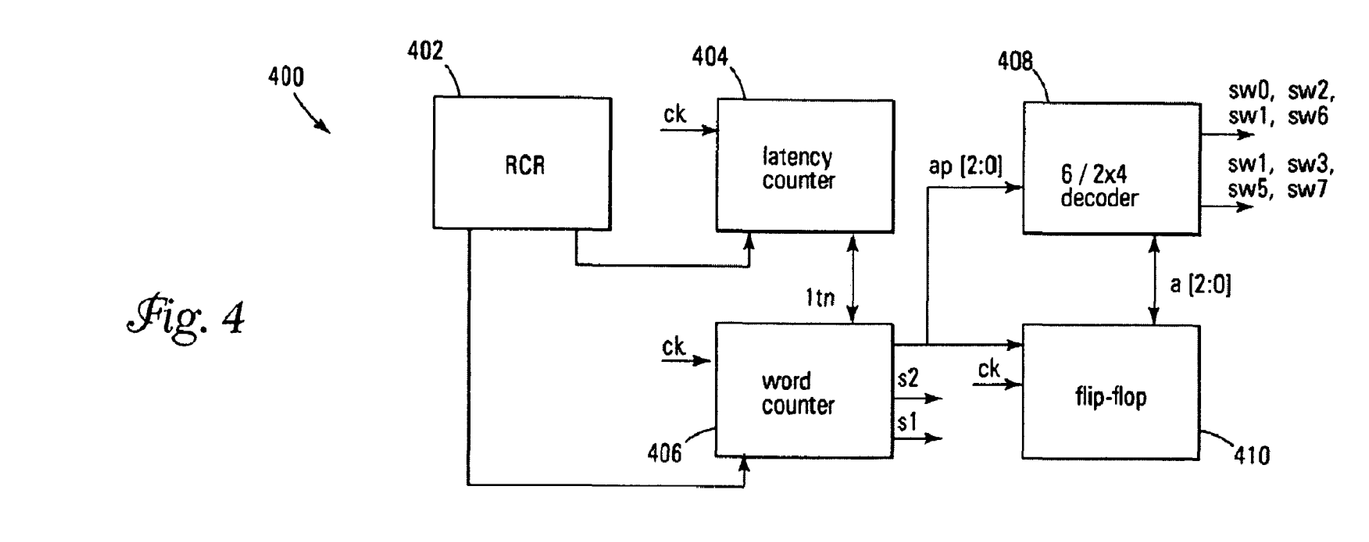
FIG. 4 shows one example of a burst state machine for a memory according to the present invention.

To perform the double word selection for the double bus architecture, the burst state machine must be modified accordingly. A simplified block diagram of a burst state machine 400 for use in connection with a double bus burst mode architecture is shown in FIG. 4. Burst state machine 400 includes RCR 402, latency counter 404, word counter 406, 6/2×4 decoder 408 and flip-flop 410. The word counter must select the new word address one clock in advance and, for this reason, the latency counter 404 must be modified to generate ltn signal one clock in advance, thereby providing through word counter 406 the anticipated inputs (ap[2:0]) to 6/2×4 decoder 408. The output of word counter 406 is delayed by one clock cycle by flip-flop 410 so that inputs a[2:0] are applied to the decoder 408 one clock cycle later. Decoder 408 provides two signals at a time: an output for sw0, sw2, sw4 or sw8, and an output for sw1, sw3, sw5 or sw7. To keep the pure latency, a double latency code (e.g., 8) must be written into RCR 202 so that in our example, the ltn signal from latency counter 404 will be raised high at the start of $(8-1)^{th}=7^{th}$ clock cycle. A data word is present on the output pad 314 (DQ[15:0]) two clock cycles later, i.e. at the start of the $9^{th}$ clock cycle, that is 8×12=96 ns from the rising edge of clock cycle 1. The latency expressed in terms of ns is the same as in the example of FIG. 2a.

Figure 4A:
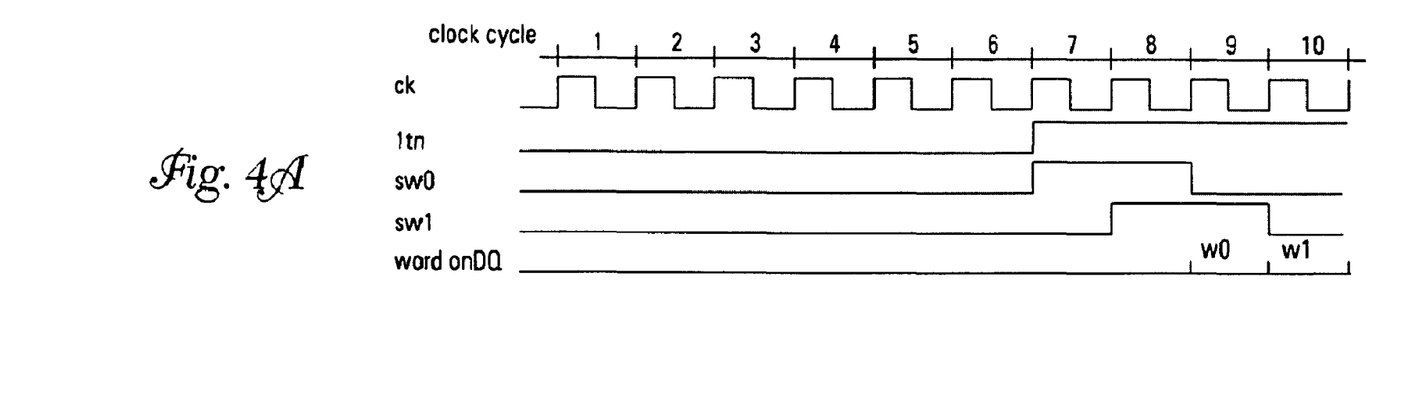
FIG. 4a shows a simplified timing diagram of the operation of the burst state machine shown in FIG. 4.
Figure 4B:
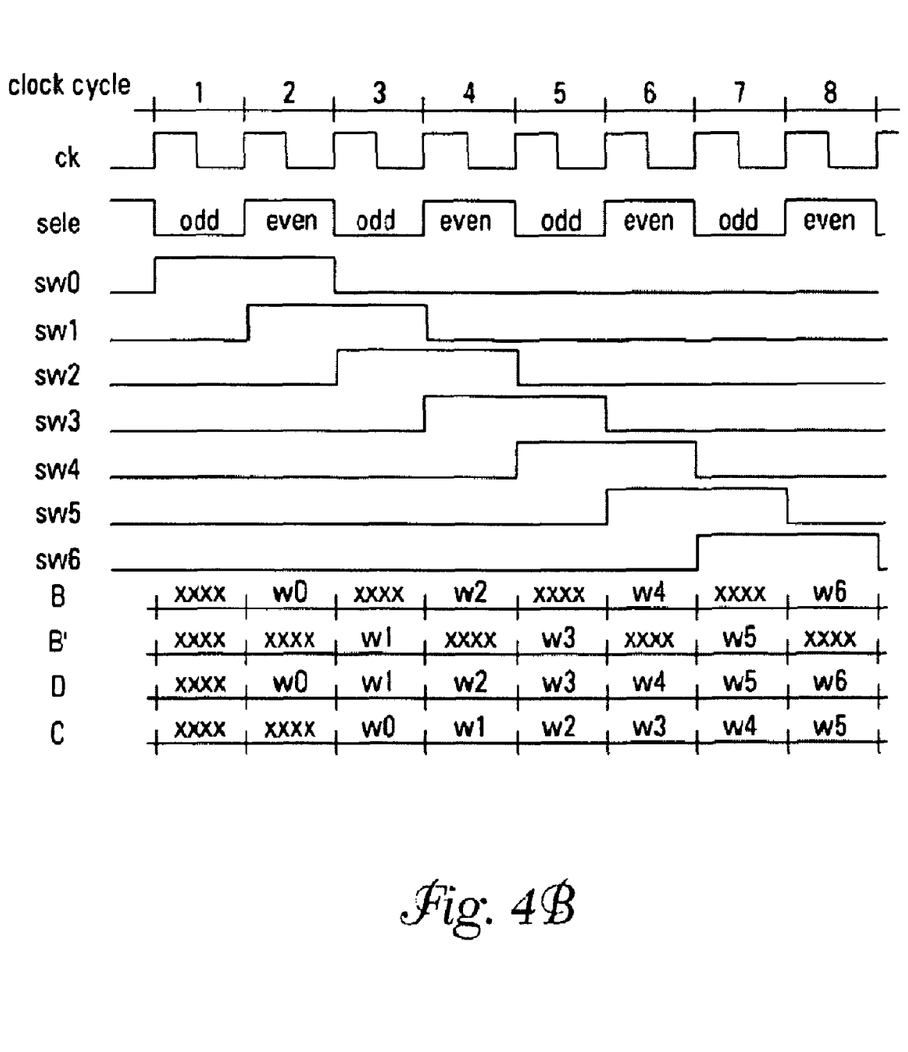
FIG. 4b shows a more detailed timing diagram of the operation of the burst state machine shown in FIG. 4.

FIG. 4a shows a simplified timing diagram of the operation of burst state machine 400. Again, 8 data words are used in this example, however a different number of data words or data bits per word could be used depending on design considerations. As can be seen in FIG. 4b, signals sw0, sw1 . . . sw6 overlap for one clock cycle for correct operation. In clock cycle 1, w0 is selected by sw0 and it is routed to B. The signal is assumed stable at node B only after the 12 ns propagation delay. In clock step 2, w1 is selected by sw1 and routed to B' in 12 ns. Now, w0 is stable at B. Since sele is high, w0 is transferred to the D bus in a negligible time. The propagation delay to move w0 to output pads 314 is thus only 12 ns.

In clock step 3, w0 is stable on the output pads 314 at node C. Word w1 is now stable at B'. Signal sele low routes the word w1 from B' to D. Word w2 is selected by sw2. It also propagates in 12 ns from A to B.

In clock step 4, w1 is stable on the output D and w2 is stable at B. Signal sele is high again and transfers w2 to D. Signals sw3 is activated and transfers w3 from A to B in 12 ns.

In clock step 5, w2 is stable on the output C. Signal sele low routes the next word w3 from B' to D. Word w4 is selected by sw4 and propagates in 12 ns from A to B.

Operation continues in this manner until the burst operation is completed. With the double bus architecture, throughput is effectively doubled without changing the overall propagation delay from A to C. In the example of FIG. 4a a clock with a period of 12 ns has been used based on an overall propagation delay of 24 ns from A to C. Of course, while 24 ns is typical of one technology, different technologies will have different propagation delays and improvements are continually being achieved. If faster or slower memory devices are used, the propagation delay may be adjusted accordingly.

Figure 5:
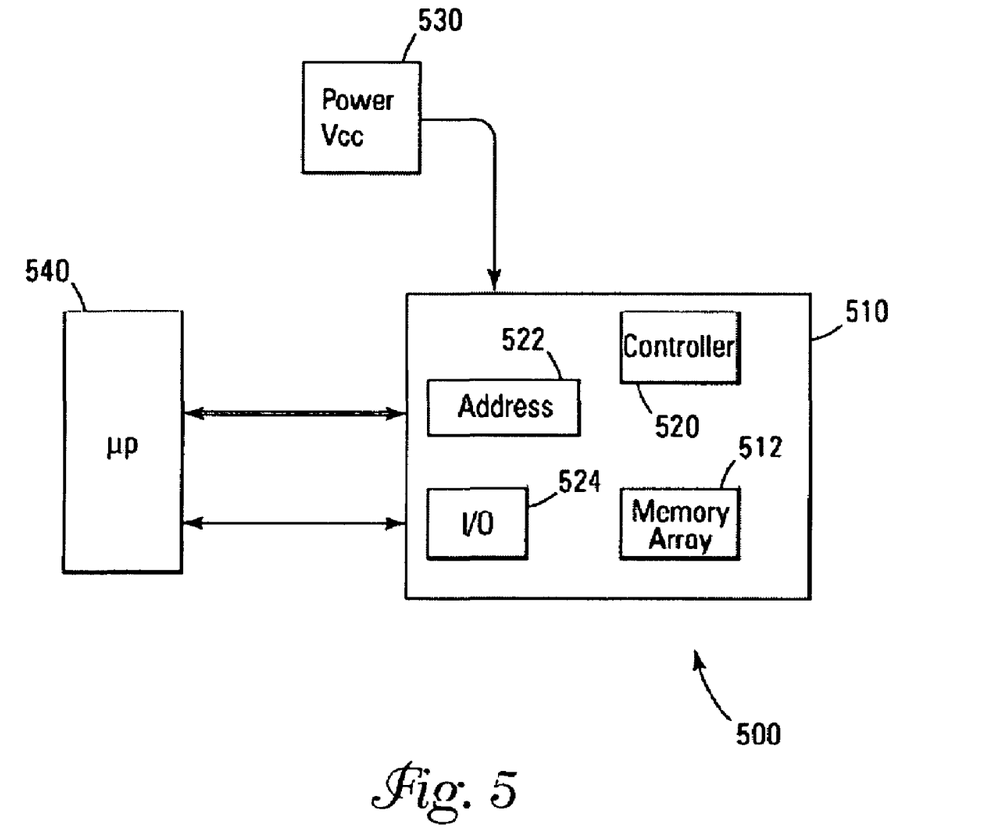
FIG. 5 shows a block diagram of a memory circuit coupled to a system including a processor.

FIG. 5 shows a computer system 500 including a memory circuit 510, a power supply 530 and a processor 540. Memory 510 includes a memory array 512 of nonvolatile memory cells (which can be flash memory cells), and a controller 520 that controls detailed operations of memory 510 such as the various individual steps necessary for carrying out writing, reading, and erasing operations and may also include the burst memory operations of the present invention. Memory 510 also includes an address decoder circuit 522 for decoding and selecting addresses provided by processor 540 to access appropriate memory cells in memory array 512, and an I/O circuit 524 for providing bi-directional communications between processor 540 and memory circuit 510.

Architectures according to the present invention may also be used in connection with different burst configurations. For example, word counter 406 and 6/2×4 decoder 408 can be configured to send a different sequence of signals sw0 . . . sw7, for example: sw5-sw4-sw7-sw6-sw1-sw0-sw3-sw2. The only limitation is that an even word must be followed by an odd word, and an odd word must be followed by an even word. All sequences of sw0 . . . sw7 signals otherwise are allowed.

CONCLUSION

The present invention includes a method and apparatus for a memory device having a burst architecture with a doubled clock rate. The throughput may be doubled by employing a double bus architecture that is multiplexed onto an output bus. The invention can be implemented with a minimum increment in silicon area and without greatly increasing the complexity of the logic controlling the core memory operation. Moreover, the throughput is doubled without increasing the memory device latency, i.e., the time needed to retrieve data from the memory from the time of the first request for the data.

What is claimed is:

1. A method of accessing a memory device, comprising:
   latching a plurality of data words;
   providing a first data word to a first data bus at a first time;
   providing a second data word to a second data bus at a second time while the first data word is being provided to the first data bus;
   providing the first data word to an output bus from the first data bus at the second time; and
   providing the second data word to the output bus from the second data bus at a third time while providing a third data word to the first data bus.

2. The method of claim 1, wherein the first time corresponds to an edge of a first clock cycle.

3. The method of claim 2, wherein the second time corresponds to one clock cycle after the edge of the first clock cycle.

4. The method of claim 3, wherein the third time corresponds to two clock cycles after the edge of the first clock cycle.

5. The method of claim 1, further comprising:
   providing a fourth data word to the second data bus at a fourth time while the third data word is being provided to the first data bus; and
   providing the third data word to the output bus from the first data bus at the fourth time.

6. The method of claim 1, wherein a propagation delay of providing a data word to the first or second data bus is approximately equal to a propagation delay of providing the data word from the first or second data bus to output pads of the memory device through the output bus.

7. The method of claim 6, wherein the propagation delay of providing a data word to the first or second data bus is approximately one clock cycle.

8. The method of claim 1, wherein providing a data word to the output bus from the first data bus and the second data bus comprises multiplexing the first data bus and the second data bus.

9. A method of accessing a memory device, comprising:
   latching a first plurality of data words and a second plurality of data words substantially concurrently;
   providing a first data word of the first plurality of data words to a first data bus at a first clock cycle and providing subsequent data words of the first plurality of data words to the first data bus every two clock cycles;
   providing a second data word of the second plurality of data words to a second data bus at a second clock cycle and providing subsequent data words of the second plurality of data words to the second data bus every two clock cycles;
   providing the first data word to an output bus from the first data bus at the second clock cycle and providing subsequent data words of the first plurality of data words to the output bus from the first data bus every two clock cycles; and
   providing the second data word to the output bus from the second data bus at a third clock cycle and providing subsequent data words of the second plurality of data words to the output bus from the second data bus every two clock cycles.

10. The method of claim 9, wherein a propagation delay of providing a data word to the first or second data bus is approximately equal to a propagation delay of providing the data word from the first or second data bus to output pads of the memory device through the output bus.

11. The method of claim 10, wherein the propagation delay of providing a data word to the first or second data bus is less than or equal to one clock cycle.

12. The method of claim 9, wherein providing a data word to the output bus from the first data bus and the second data bus comprises multiplexing the first data bus and the second data bus to alternately select a data word from between the first and second data busses.

13. The method of claim 9, wherein providing a data word on a clock cycle further comprises providing the data word on a rising edge of that clock cycle.

14. A memory device, comprising:
   a memory array;
   a plurality of sensing devices coupled to the memory array;
   a first data bus for receiving data words from a first portion of the plurality of sensing devices;
   a second data bus for receiving data words from a second portion of the plurality of sensing devices; and
   a switch to multiplex the data words from the first and second data busses onto an output bus;
   wherein the memory device is adapted to sequentially provide individual data words from the first portion of the plurality of sensing devices to the first data bus;
   wherein the memory device is adapted to sequentially provide individual data words from the second portion of the plurality of sensing devices to the second data bus; and wherein the memory device is adapted to alternately provide data words form the first and second data busses onto the output bus.

15. The memory device of claim 14, wherein the memory device is adapted to sequentially provide individual data words from the first portion of the plurality of sensing devices to the first data bus every two clock cycles.

16. The memory device of claim 14, wherein the memory device is adapted to sequentially provide individual data words from the second portion of the plurality of sensing devices to the second data bus every two clock cycles.

17. The memory device of claim 16, wherein the memory device is adapted to sequentially provide individual data words from the second portion of the plurality of sensing devices to the second data bus at a one clock cycle offset from providing individual data words from the first portion of the plurality of sensing devices to the first data bus.

18. The memory device of claim 14, wherein the memory device is adapted to alternately provide data words form the first and second data busses onto the output bus on every clock cycle.

19. A system, comprising:
a processor; and
a memory device coupled to the processor, the memory device comprising:
    a memory array;
    a plurality of sensing devices coupled to the memory array;
    a first data bus for receiving data words from a first portion of the plurality of sensing devices;
    a second data bus for receiving data words from a second portion of the plurality of sensing devices; and
    a switch to multiplex the data words from the first and second data busses onto an output bus;
    wherein the memory device is adapted to sequentially provide individual data words from the first portion of the plurality of sensing devices to the first data bus;
    wherein the memory device is adapted to sequentially provide individual data words from the second portion of the plurality of sensing devices to the second data bus; and
    wherein the memory device is adapted to alternately provide data words form the first and second data busses onto the output bus.

20. The system of claim 19, further comprising:
wherein the memory device is adapted to sequentially provide individual data words from the first portion of the plurality of sensing devices to the first data bus every two clock cycles;
wherein the memory device is adapted to sequentially provide individual data words from the second portion of the plurality of sensing devices to the second data bus every two clock cycles; and
wherein the memory device is adapted to alternately provide data words form the first and second data busses onto the output bus on every clock cycle.

21. The system of claim 19, wherein the memory device is adapted to sequentially provide individual data words from the second portion of the plurality of sensing devices to the second data bus at a one clock cycle offset from providing individual data words from the first portion of the plurality of sensing devices to the first data bus.

22. A system, comprising:
a processor; and
a memory device coupled to the processor, the memory device comprising:
    a memory array;
    a bank of n×m sense amplifiers coupled to the memory array to read data from the memory array;
    a plurality of first and second storage circuits coupled to the outputs of the sense amplifiers;
    a first plurality of driver circuits coupled to the outputs of the first and second storage circuits;
    a second plurality of driver circuits coupled to the outputs of the first and second storage circuits;
    a first bus coupled to the outputs of the first plurality of driver circuits to receive even data words;
    a second bus coupled to the outputs of the second plurality of driver circuits to receive odd data words;
    a selection circuit comprising a plurality of first inputs coupled to the first bus, a plurality of second inputs coupled to the second bus and a plurality of outputs selectively coupled to the plurality of first and second inputs;
    an output bus coupled to a plurality of the outputs of the selection circuit; and
    a controller to provide control signals to the memory wherein even and odd data words are loaded respectively on the first and second busses and alternately switched by the selection circuit to the output bus.

* * * * *